US009413309B1

(12) United States Patent
Zhao et al.

(10) Patent No.: US 9,413,309 B1
(45) Date of Patent: Aug. 9, 2016

(54) APPARATUS AND METHODS FOR A CASCODE AMPLIFIER TOPOLOGY FOR MILLIMETER-WAVE POWER APPLICATION

(71) Applicant: Analog Devices Global, Hamilton (BM)

(72) Inventors: Dixian Zhao, Leuven (BE); Patrick Reynaert, Leuven (BE); Michael F. Keaveney, Lisnagry (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/668,832

(22) Filed: Mar. 25, 2015

(51) Int. Cl.
*H03F 3/45* (2006.01)
*H03F 3/193* (2006.01)
*H03F 1/02* (2006.01)

(52) U.S. Cl.
CPC .............. *H03F 3/193* (2013.01); *H03F 1/0205* (2013.01); *H03F 3/45179* (2013.01); *H03F 2200/451* (2013.01); *H03F 2203/45024* (2013.01)

(58) Field of Classification Search
USPC ......................................... 330/253, 292, 260
IPC .................................................... H03F 3/45
See application file for complete search history.

(56) References Cited

U.S. PATENT DOCUMENTS

| | | | |
|---|---|---|---|
| 3,423,685 A | 1/1969 | Hayes | |
| 4,484,147 A | 11/1984 | Metz | |
| 4,885,548 A * | 12/1989 | Wakimoto | ................ H03F 1/48 330/260 |
| 5,343,163 A | 8/1994 | Linder et al. | |
| 5,412,336 A | 5/1995 | Barrett, Jr. et al. | |
| 6,396,346 B1 * | 5/2002 | Ranmuthu | ............... G11B 5/02 330/252 |
| 6,400,229 B1 | 6/2002 | Tran et al. | |
| 6,496,074 B1 | 12/2002 | Sowlati | |
| 6,566,949 B1 * | 5/2003 | Park | .................... H03F 3/45179 330/252 |
| 6,737,920 B2 | 5/2004 | Jen et al. | |
| 7,697,915 B2 | 4/2010 | Behzad et al. | |
| 2003/0080815 A1 * | 5/2003 | Yin | .......................... H03F 1/14 330/260 |
| 2007/0046376 A1 * | 3/2007 | Van Der Heijden | .... H03F 1/083 330/292 |
| 2007/0146070 A1 * | 6/2007 | Bromberger | ............. H03F 1/42 330/252 |

(Continued)

FOREIGN PATENT DOCUMENTS

JP 2014-183371 9/2014

OTHER PUBLICATIONS

Cassan et al., "A 1-V transformer-feedback low-noise amplifier for 5-GHz wireless LAN in 0.18-μm CMOS," IEEE Journal of Solid-State Circuits, Mar. 2003, pp. 427-435, vol. 38, No. 3.

(Continued)

*Primary Examiner* — Patricia T Nguyen
(74) *Attorney, Agent, or Firm* — Knobbe, Martens, Olson & Bear LLP

(57) ABSTRACT

Provided herein are apparatus and methods for a cascode amplifier topology for millimeter-wave power application. The cascode amplifier can use a neutralized common source stage cascoded with a bootstrapped common gate stage to provide an amplifier topology having enhanced performance, gain, stability and reliability. Additionally, a bootstrap capacitor of the common gate stage can be patterned between the source fingers and the drain fingers of a cascode transistor so as to improve device performance. Operating as an RF power amplifier, a single-stage cascode amplifier using the neutralized common source stage with the bootstrapped common gate stage can provide greater than 15 dB of power gain to signals of the E band.

20 Claims, 5 Drawing Sheets

(56) References Cited

U.S. PATENT DOCUMENTS

2013/0063210 A1* 3/2013 Corsi ............... H03F 1/223
330/253
2014/0049320 A1 2/2014 Manetakis

OTHER PUBLICATIONS

Deferm et al., "W-band differential power amplifier design in 45 nm low power CMOS," Solid-State Electronics, 2013, pp. 41-45, vol. 82.
Oh, et al., "A 77-GHz CMOS power amplifier with a parallel power combiner based on transmission-line transformer," IEEE Transactions on Microwave Theory and Techniques, Jul. 2013, pp. 2662-2669, vol. 61, No. 7.

Razavi, Behzad, "CMOS transceivers at 60 GHz and beyond," IEEE, 2007, pp. 1983-1986, Electrical Engineering Department, University of California, Los Angeles.
Wang et al., "A 1V 19.3dBm 79 GHz power amplifier in 65nm CMOS," 2012 IEEE International Solid-State Circuits Conference, ISSCC 2012, Session 15, mm-WAVE & THz Techniques, 2012, pp. 260-262, National Taiwan University, Taipei, Taiwan.
Zhao et al., "A 0.9V 20.9dBm 22.3%-PAE E-Band power amplifier with broadband parallel-series power combiner in 40nm CMOS," 2014 IEEE International Solid-State Circuits Conference, ISSCC 2014, Session 14, Millimeter-Wave and Terahertz Techniques, 2014, pp. 248-250, KU Leuven, Leuven, Belgium.

* cited by examiner

APPARATUS AND METHODS FOR A CASCODE AMPLIFIER TOPOLOGY FOR MILLIMETER-WAVE POWER APPLICATION

BACKGROUND

1. Field

Embodiments of the invention relate to electronic circuits, and more particularly, to radio frequency (RF) amplifiers used for power application.

2. Description of the Related Technology

Radio frequency (RF) amplifiers are used in a variety of applications, such as in transmitters for wireless communication systems. In one application, an RF amplifier is used as an RF power amplifier (PA) to amplify RF signals for transmission in the 71-to-76 GHz (gigahertz) and 81-to-86 GHz bands known as E-band. In another application an RF amplifier is used as an RF PA to amplify signals from a WiFi source to boost a WiFi hotspot signal within a wireless local area network (WLAN).

SUMMARY

In one embodiment, an apparatus comprises an amplifier. The amplifier comprises a first circuit configured to receive an input signal, and the first circuit has neutralization of gate-to-drain parasitic capacitance. The amplifier comprises a second circuit configured to generate an amplified signal, and the first circuit and the second circuit together form a cascode circuit. The amplifier includes a first node between the first circuit and the second circuit. The second circuit has at least a first capacitor having an amount of capacitance tailored to an intended operating band of the amplifier such that the first capacitor is configured to resonate with a first parasitic capacitance between the first node and an AC ground to substantially cancel the first parasitic capacitance.

The first circuit can comprise a first differential circuit. The input signal can comprise a differential input signal, and the first differential circuit has cross-coupled capacitive coupling for neutralization. The second circuit can comprise a second differential circuit, and the amplified signal can comprise a differential signal. The first differential circuit and the second differential circuit together form a differential cascode circuit.

The apparatus can include a second node between the first circuit and the second circuit. The second circuit has a second capacitor having an amount of capacitance tailored to an intended operating band of the amplifier such that the second capacitor is configured to resonate with a second parasitic capacitance between the second node and the AC ground to substantially cancel the second parasitic capacitance.

The first capacitor and the second capacitor can be configured to resonate with the first parasitic capacitance and the second parasitic capacitance, respectively, without an inductor.

The first differential circuit can comprise a source coupled transistor pair, a third capacitor, and a fourth capacitor. The source coupled transistor pair comprises a first transistor and a second transistor configured to receive the differential input signal between a gate of the first transistor and a gate of the second transistor. The third capacitor is electrically connected between the gate of the first transistor and a drain of the second transistor, and the third capacitor is configured to neutralize a gate-to-drain parasitic capacitance of the first transistor. The fourth capacitor is electrically connected between the gate of the second transistor and a drain of the first transistor, and the fourth capacitor is configured to neutralize a gate-to-drain parasitic capacitance of the second transistor.

The second differential circuit can comprise a third transistor and a fourth transistor. The third transistor has a source electrically connected to the drain of the first transistor and a gate electrically connected to a bias source. The fourth transistor has a source electrically connected to the drain of the second transistor and a gate electrically connected to the bias source. The third transistor and the fourth transistor can be configured to provide the amplified signal between a drain of the third transistor and a drain of the fourth transistor.

The first capacitor can be electrically connected between the drain and the source of the third transistor; and the second capacitor can be electrically connected between the drain and the source of the fourth transistor.

The first transistor, the second transistor, the third transistor, and the fourth transistor can comprise NMOS transistors. The first transistor, the second transistor, the third transistor, and the fourth transistor can comprise PMOS transistors.

The amplifier can comprise an RF power amplifier configured to have a gain and stability factor at least partially dependent upon the first through fourth capacitors.

The third transistor can comprise a drain metallization pattern forming a first electrode of the first capacitor and a source metallization pattern forming a second electrode of the first capacitor. The fourth transistor can comprise a drain metallization pattern forming a first electrode of the second capacitor and a source metallization pattern forming a second electrode of the second capacitor. The metallization patterns can be repeated on at least two metallization layers.

The drain metallization pattern and the source metallization pattern of the third transistor can have an area such that an amount of capacitance of the first capacitor is commensurate with the first parasitic capacitance. The drain metallization pattern and the source metallization pattern of the fourth transistor have an area such that an amount of capacitance of the second capacitor is commensurate with the second parasitic capacitance.

The amplifier can be embodied in an integrated circuit.

The first circuit can comprise a common source transistor and a series LC network. The common source transistor can be configured to receive the input signal at a gate of the common source transistor. The series LC network is electrically connected between the gate of the common source transistor and a drain of the common source transistor. The series LC network can be configured to neutralize a gate-to-drain parasitic capacitance of the common source transistor.

The second circuit can comprise a cascode transistor. The cascode transistor has a source electrically connected to the drain of the common source transistor and a gate electrically connected to a bias source. The cascode transistor can be configured to provide the amplified signal at a drain of the cascode transistor.

A first capacitor can be electrically connected between the drain and the source of the cascode transistor. The first capacitor can be configured to resonate with a first parasitic capacitance between the drain of the common source transistor and an AC ground to substantially cancel the first parasitic capacitance.

The amplifier can comprise an RF power amplifier configured to have a gain and stability factor at least partially dependent upon the first through fourth capacitors.

The cascode transistor can comprise a drain metallization pattern forming a first plate of the first capacitor and a source metallization pattern forming a second plate of the first capacitor.

The drain metallization pattern and the source metallization pattern of the cascode transistor can have an area such that an amount of capacitance of the first capacitor is commensurate with the first parasitic capacitance.

In another embodiment, an apparatus for RF power amplification comprises: a means for amplifying an input signal to generate an amplified signal; a means for neutralizing a gate-to-drain parasitic capacitance of the amplifying means; and a means for resonating with a parasitic capacitance between a node and an AC ground of the amplifying means to substantially cancel the first parasitic capacitance.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1A:
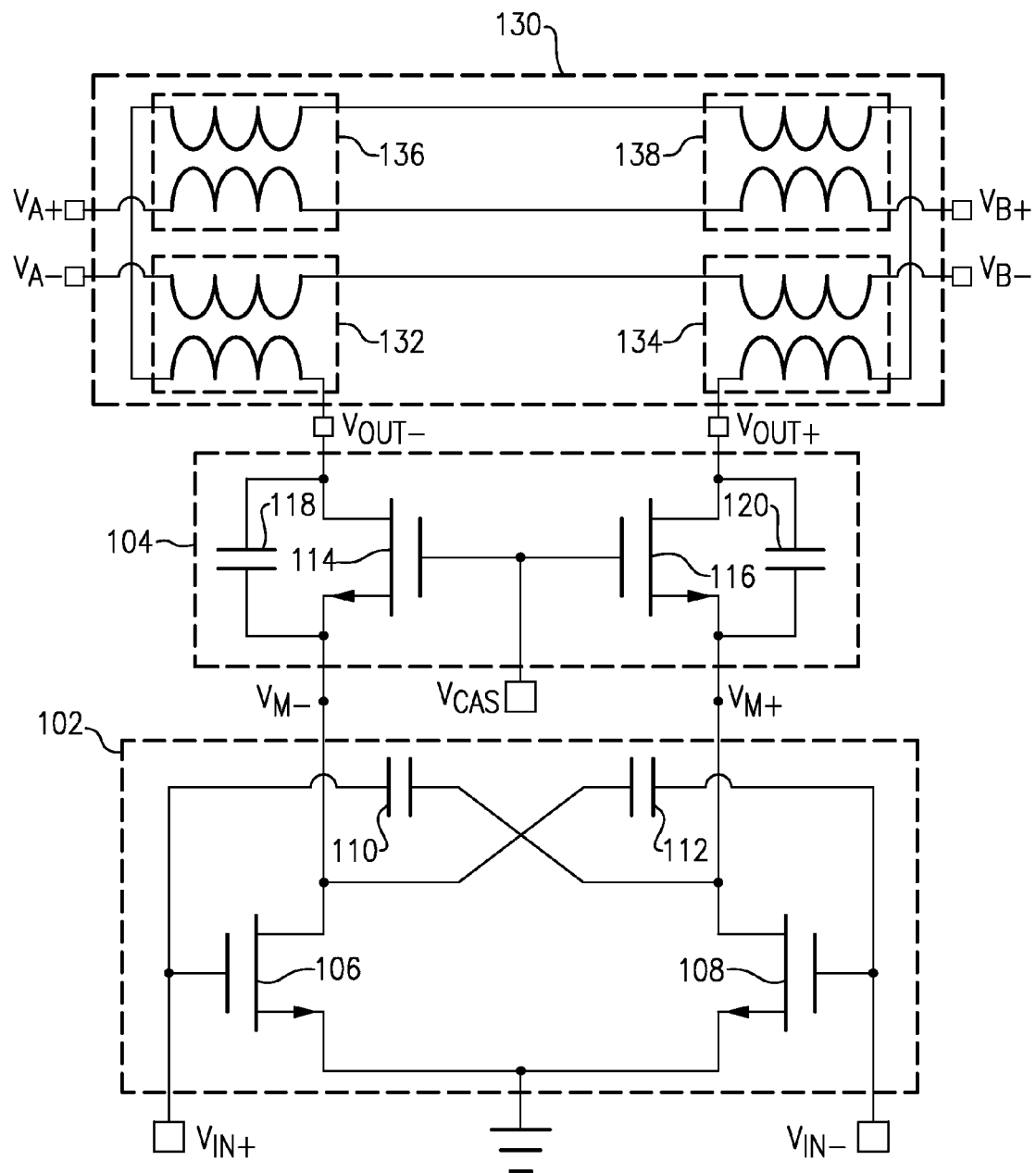
FIG. 1A is a schematic diagram of a differential RF amplifier and a load in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Radio frequency (RF) signals are attenuated within the atmosphere, and the amount of attenuation depends upon various factors including the RF signal frequency and the atmospheric conditions. By way of example, at sea level in dry air conditions an 80 GHz (gigahertz) signal has attenuation of approximately 0.01 dB/km (decibel per kilometer) while in humid conditions an 80 GHz signal has attenuation of approximately 0.3 dB/km.

RF signals within the E-band, covering frequencies from 71-76 GHz and 81-86 GHz have potential to play a key role in future 5G (fifth-generation mobile) networks, such as mobile backhaul and small cell applications. However, for a multi-Gbps (gigabit per second) link exceeding 3 km (kilometers) distance, an output power (POUT) of at least 22 dBm (decibel-milliwatts) is desirable to assure that the signal can be received after undergoing attenuation over the transmission path. For 99.99% weather availability worldwide such output power requirements place constraints on silicon-based RF amplifiers designed using low-cost silicon wafer processes.

In order to avail worldwide use of RF signals within the E-band, RF amplifiers should have uniform power exceeding 20 dBm to accommodate rain attenuation. RF amplifiers used as power amplifiers (PAs) for amplifying RF signals of the E-band can use circuit topologies developed in MMIC (monolithic-microwave-integrated-circuit) HEMT (high-electron mobility transistor) processes such as GaN (Gallium Nitride) and GaAs (Gallium Arsenide), but such processes are relatively expensive to use.

Therefore, there is a need for alternative RF amplifier topologies suitable for production using low cost processes, such as CMOS (complementary metal oxide semiconductor) processes.

Provided herein are apparatus and methods for a cascode amplifier topology for millimeter-wave power application. The cascode amplifier can use FETs (field effect transistors) and capacitors fabricated from a CMOS process to create an unconditionally stable RF amplifier for use as an RF power amplifier with gain exceeding 20 dB.

FIG. 1A is a schematic diagram of a differential RF amplifier and a load 130 in accordance with the teachings herein. The differential RF amplifier includes a neutralized common-source stage 102 and a bootstrapped common-gate stage 104. As shown in FIG. 1, the neutralized common-source stage 102 is electrically connected to ground; however, in other configurations the neutralized common-source stage 102 can be electrically connected to another voltage reference other than ground. The neutralized common-source stage 102 receives a first input signal $V_{IN+}$ and a second input signal $V_{IN-}$ defining an input differential signal equal to $V_{IN+}$ minus $V_{IN-}$. The neutralized common-source stage 102 additionally provides a first intermediate signal $V_{M-}$ and a second intermediate signal $V_{M+}$. The bootstrapped common-gate stage 104 is electrically connected in a cascode configuration to the neutralized common-source stage 102, and receives a bias voltage $V_{CAS}$, the first intermediate signal $V_{M-}$, and the second intermediate signal $V_{M+}$. The bootstrapped common-gate stage 104 additionally provides a first output signal $V_{OUT-}$ and a second output signal $V_{OUT+}$ defining an output differential signal equal to $V_{OUT+}$ minus $V_{OUT-}$. The load 130 is electrically connected to the bootstrapped common-gate stage 104 and provides a first coupled signal $V_{A+}$, a second coupled signal $V_{A-}$, a third coupled signal $V_{B+}$, and a fourth coupled signal $V_{B-}$.

In the configuration of FIG. 1A, the differential RF amplifier can operate as an RF power amplifier delivering power to the load 130. Also, in the illustrated embodiment of FIG. 1A, the load 130 is a power divider, which divides the differential output power associated with the first output signal $V_{OUT-}$ and the second output signal $V_{OUT+}$. The load 130 provides differential power divided between a first differential divided signal equal to $V_{A+}$ minus $V_{A-}$ and a second differential divided signal equal to $V_{B+}$ minus $V_{B-}$. Although the differential RF amplifier is shown connected to the load 130, other types of loads are possible. For instance, as known to those skilled in the art of designing RF power amplifiers, the load 130 can be replaced with a transformer, a power combiner, an RF choke, an LC matching network, an antenna, and the like.

The neutralized common-source stage 102 includes a first common source N-channel field effect transistor (NFET) 106 and a second common source NFET 108. A source of the first common source NFET 106 is electrically coupled to a source of the second common source NFET 108 and to ground; hence the first common source NFET 106 and the second common source NFET 108 form a common source pair. A gate of the first common source NFET 106 receives the first input signal $V_{IN+}$, and a gate of the second common source NFET 108 receives the second input signal $V_{IN-}$. A drain of the first common source NFET 106 provides the first intermediate signal $V_{M-}$, and a drain of the second common source NFET 108 provides the second intermediate signal $V_{M+}$. Additionally, a first neutralizing capacitor 110 is electrically connected between the gate of the first common source NFET 106 and the drain of the second common source NFET 108.

Also, a second neutralizing capacitor 112 is electrically connected between the gate of the second common source NFET 108 and the drain of the first common source NFET 106.

The first neutralizing capacitor 110 and the second neutralizing capacitor 112 can neutralize capacitance associated with the first common source NFET 106 and the second common source NFET 108, respectively. Due to the Miller effect and the opposite polarity from the cross-coupling, the first neutralizing capacitor 110 and the second neutralizing capacitor 112 appear as if they were capacitors of negative value. This advantageously enhances the performance and stability of the neutralized common-source stage 102.

The bootstrapped common-gate stage 104 includes a first common gate NFET 114 and a second common gate NFET 116. A gate of the first common gate NFET 114 is electrically coupled to a gate of the second common gate NFET 116 and receives the bias voltage $V_{CAS}$; hence the first common gate NFET 114 and the second common gate NFET 116 form a common gate pair. A source of the first common gate NFET 114 is electrically coupled to the drain of the first common source NFET 106 such that it receives the first intermediate signal $V_{M-}$. A source of the second common gate NFET 116 is electrically coupled to the drain of the second common source NFET 108 such that it receives the second intermediate signal $V_{M+}$. A drain of the first common gate NFET 114 provides the first output signal $V_{OUT-}$, and a drain of the second common gate NFET 116 provides the second output signal $V_{OUT+}$. Additionally, a first bootstrap capacitor 118 is electrically connected between the source and the drain of the first common gate NFET 114, and a second bootstrap capacitor 120 is electrically connected between the source and the drain of the second common gate NFET 116.

The first bootstrap capacitor 118 and the second bootstrap capacitor 120 can reduce or eliminate parasitic capacitance associated with the drain of the first common source NFET 106 and the drain of the second common source NFET 108, respectively. This advantageously enhances the performance while augmenting a gain of the amplifier of FIG. 1A. The disclosed techniques permit the amplifier of FIG. 1A to be advantageously fabricated by an inexpensive CMOS process and provide performance for amplifying RF signals of the E band. For instance, when fabricated using a 40 nm CMOS process, the amplifier of FIG. 1A can operate as an RF power amplifier (PA) achieving an RF gain greater than 20 dB for signals of the E band.

Amplifier stages can be cascaded for increased gain. For example, transformers can be used to couple between amplifier stages. In the illustrated example, the load 130 corresponds to a splitter for amplification by two subsequent stages and includes a first transformer 132, a second transformer 134, a third transformer 136, and a fourth transformer 138. The first transformer 132 receives the first output signal $V_{OUT-}$ and is electrically connected to the third transformer 136. The second transformer receives the second output signal $V_{OUT+}$ and is electrically connected to the fourth transformer 138. The first transformer 132 provides the second coupled signal $V_{A-}$. The second transformer 134 provides the third coupled signal $V_{B-}$. The third transformer 136 provides the first coupled signal $V_{A+}$, and the fourth transformer 138 provides the third coupled signal $V_{B+}$. Of course, other loads can be applicable, such as a single transformer for coupling between two amplifier stages.

Figure 1B:
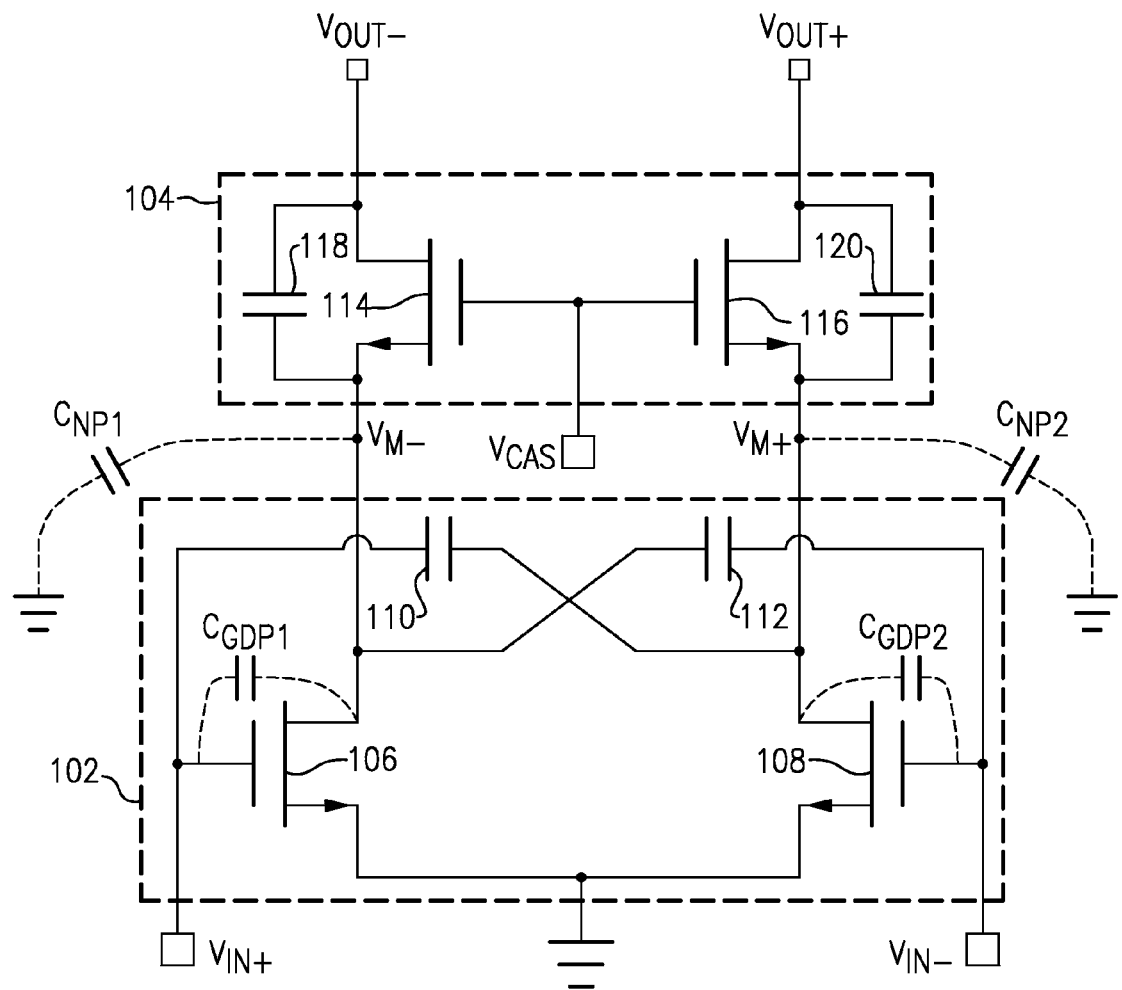
FIG. 1B is a schematic diagram including parasitic and inherent capacitances of a differential RF amplifier in accordance with the teachings herein.

FIG. 1B is a schematic diagram including parasitic capacitances of a differential RF amplifier in accordance with the teachings herein. The differential RF amplifier of FIG. 1B is similar to the differential amplifier of FIG. 1A except the load 130 is not shown; in addition, parasitic capacitances associated with the neutralized common-source stage 102 and the bootstrapped common-gate stage 104 are illustrated.

FIG. 1B shows a first parasitic capacitance $C_{GDP1}$ between the gate and the drain of the first common source NFET 106 and a second parasitic capacitance $C_{GDP2}$ between the gate and the drain of the second common source NFET 108. The first parasitic capacitance $C_{GDP1}$ and the second parasitic capacitance $C_{GDP2}$ are parasitic capacitances relating to the first common source NFET 106 and the second common source NFET 108, respectively. Furthermore, the first parasitic capacitance $C_{GDP1}$ and the second parasitic capacitance $C_{GDP2}$ can degrade the stability and power gain of the differential amplifier of FIG. 1A. Based upon simulation and/or calculations, the amount of capacitance of the first neutralizing capacitor 110 and the second neutralizing capacitor 112 can be selected to advantageously neutralize the effects of the first parasitic capacitance $C_{GDP1}$ and the second parasitic capacitance $C_{GDP2}$, respectively. In one embodiment, the amount of capacitance of the first neutralizing capacitor 110 and the second neutralizing capacitor 112 can be about the same as the amount of capacitance of the first parasitic capacitance $C_{GDP1}$ and the second parasitic capacitance $C_{GDP2}$.

FIG. 1B also shows a third parasitic capacitance $C_{NP1}$ between the drain of the first common source NFET 106 and an AC ground. Additionally there is a fourth parasitic capacitance $C_{NP2}$ between the drain of the second common source NFET 108 and AC ground. In this configuration, the concept of AC ground means small signal ground, a common circuit concept to those practiced in the art of designing amplifiers. The third parasitic capacitance $C_{NP1}$ and the fourth parasitic capacitance $C_{NP2}$ are parasitic capacitances relating to the connections between the neutralized common source stage 102 and the bootstrapped common gate stage 104. The third parasitic capacitance $C_{NP1}$ and the fourth parasitic capacitance $C_{NP2}$ shunt signal current to AC ground and thus reduce the power gain of the differential RF amplifier of FIG. 1B. Due to the Miller effect and the corresponding phase shifts, the first bootstrap capacitor 118 can behave like an inductor and cancel the third parasitic capacitance $C_{NP1}$ at a desired RF frequency. Further, in behaving like an inductor, the first bootstrap capacitor 118 blocks RF currents shunted to ground, thereby improving the gain of the differential RF amplifier. Similarly, at RF frequencies, the second bootstrap capacitor 120 can behave like an inductor and cancel the fourth parasitic capacitance $C_{NP2}$. Further, in behaving like an inductor, the second bootstrap capacitor 120 also blocks RF currents shunted to ground, thereby improving the gain of the differential RF amplifier of FIG. 1B.

Figure 2A:
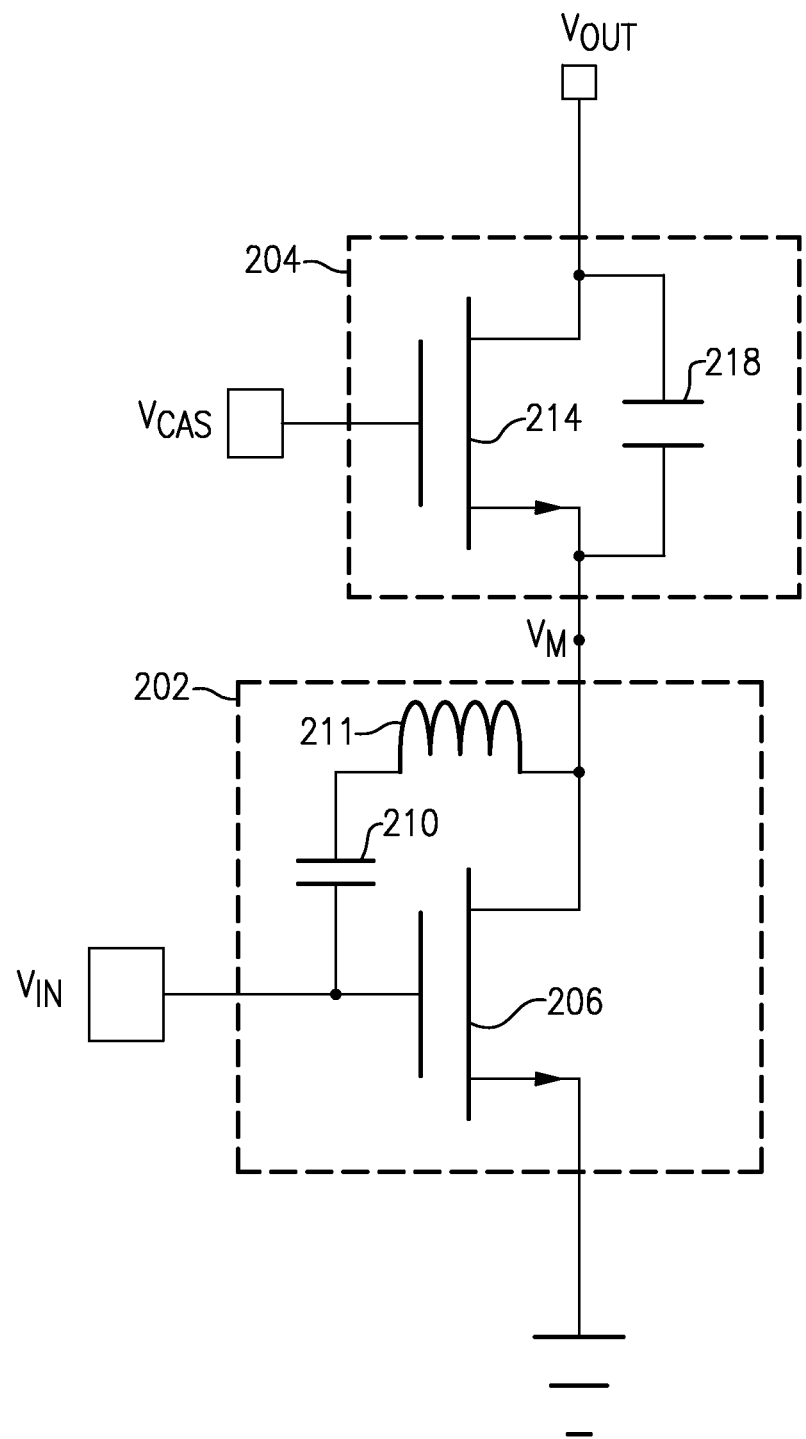
FIG. 2A is a schematic diagram of an RF amplifier according to another embodiment.

FIG. 2A is a schematic diagram of an RF amplifier according to another embodiment. The RF amplifier of FIG. 2A includes a neutralized single-ended common-source stage 202 and a bootstrapped common-gate stage 204. The neutralized common-source stage 202 is electrically connected to ground or to a different voltage reference, and receives a single input signal $V_{IN}$. The neutralized common-source stage 202 additionally provides a single intermediate signal $V_M$. The bootstrapped common-gate stage 204 is electrically connected in a cascode configuration to the neutralized common-source stage 202, and receives a bias voltage $V_{CAS}$ and the single intermediate signal $V_M$. The bootstrapped common-gate stage 204 additionally provides a single output signal $V_{OUT}$. Additionally, in the configuration of FIG. 2A, the RF power amplifier can operate as a power amplifier delivering power through the single output signal $V_{OUT}$. The output node $V_{OUT}$ can be inductively coupled to a power supply rail for biasing.

The neutralized common-source stage 202 includes a single common source NFET 206 having a source electrically coupled to ground in a common-source configuration. A gate of the single common source NFET 206 receives the single input signal $V_{IN}$. A drain of the single common source NFET 206 provides the single intermediate signal $V_M$. Additionally, a series capacitor 210 and a series inductor 211 are electrically connected in series between the gate and the drain of the single common source NFET 206. The series capacitor 210 behaves as an open-circuit at DC and a short-circuit at RF frequencies.

The series inductor 211 can neutralize capacitance associated with the single common source NFET 206 to advantageously enhance the performance and stability of the neutralized common-source stage 202 at a desired RF frequency.

The bootstrapped common-gate stage 204 includes a single common gate NFET 214 having a gate electrically coupled to receive the bias voltage $V_{CAS}$. A source of the single common gate NFET 214 is electrically coupled to the drain of the single common source NFET 206 such that it receives the single intermediate signal $V_M$. A drain of the single common gate NFET 214 provides the single output signal $V_{OUT}$. The drain of the single common gate NFET 214 can be biased via an inductor. Additionally, a single bootstrap capacitor 218 is electrically connected between the source and the drain of the single common gate NFET 214.

The single bootstrap capacitor 218 can reduce or eliminate parasitic capacitance associated with the drain of the single common source NFET 206. This advantageously enhances the performance and stability while augmenting a gain of the RF amplifier of FIG. 2A.

Figure 2B:
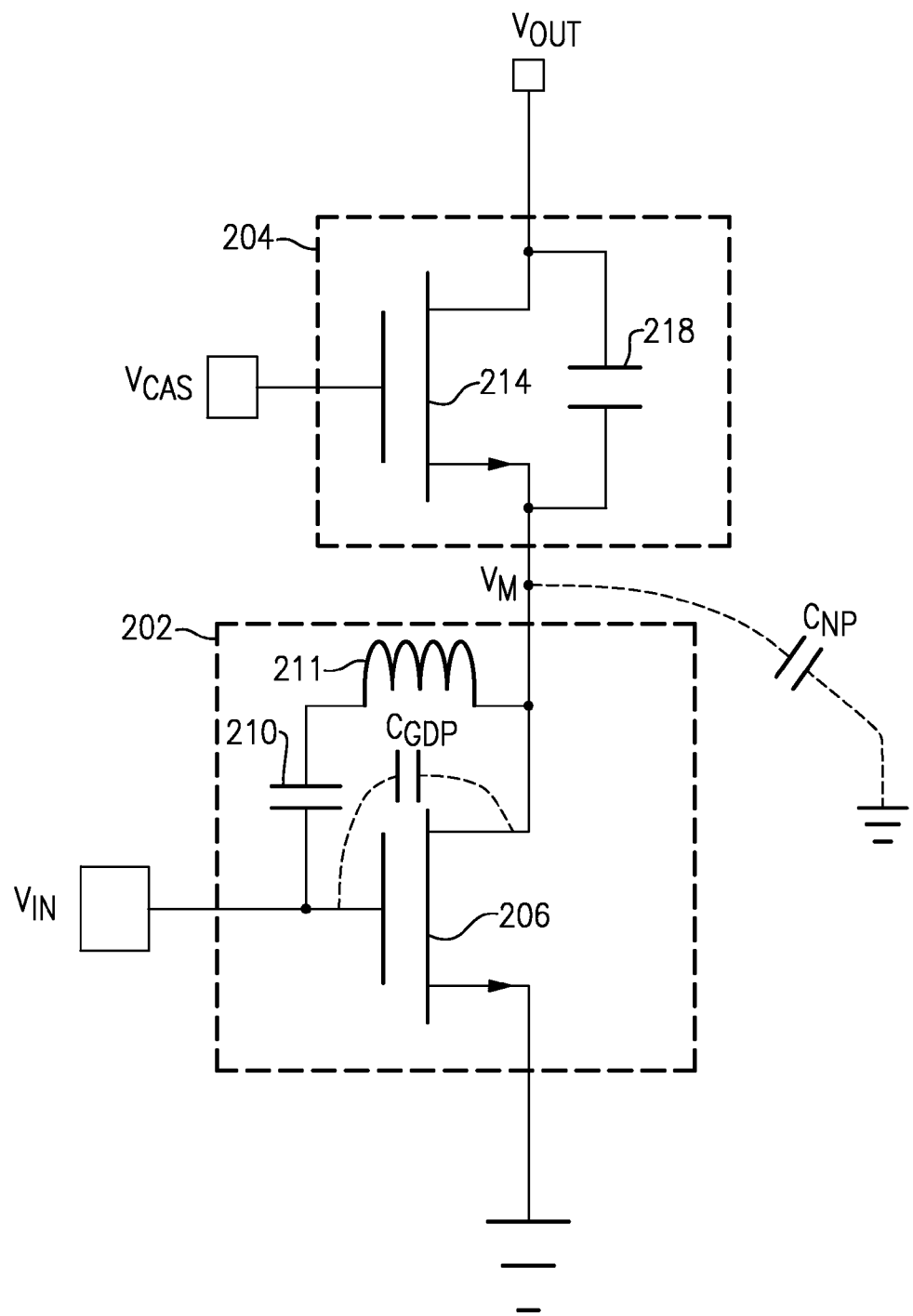
FIG. 2B is a schematic diagram including parasitic capacitances of an RF amplifier according to another embodiment.

FIG. 2B is a schematic diagram including parasitic capacitances of an RF amplifier of FIG. 2A; in addition, parasitic capacitances associated with the neutralized common-source stage 202 and the bootstrapped common-gate stage 204 are illustrated.

FIG. 2B shows an NFET parasitic capacitance $C_{GDP}$ between the gate and the drain of the single common source NFET 206. The NFET parasitic capacitance $C_{GDP}$ is an inherent capacitance relating to the single common source NFET 206. Furthermore, the NFET parasitic capacitance $C_{GDP}$ can degrade stability of the RF amplifier of FIG. 2B. The series capacitor 210 provides DC blocking. Based upon simulation and/or calculations, the amount of inductance of the series inductor 211 can be selected to advantageously neutralize the effect of the NFET parasitic capacitance $C_{GDP}$ by, for example, resonating with the capacitance at the intended frequency of operation.

FIG. 2B also shows an intermediate parasitic capacitance $C_{NP}$ between the drain of the single common source NFET 206 and an AC ground. The intermediate parasitic capacitance $C_{NP}$ is a parasitic capacitance relating to the connections between the neutralized common source stage 202 and the bootstrapped common gate stage 204. The intermediate parasitic capacitance $C_{NP}$ reduces the gain of the differential RF amplifier of FIG. 2B. At RF frequencies, the single bootstrap capacitor 218 can behave like an inductor and cancel the intermediate parasitic capacitance $C_{NP}$. In this way, cancellation of the intermediate parasitic capacitance $C_{NP}$ can advantageously increase the gain and performance of the RF cascode amplifier shown in FIG. 2B.

Figure 3:
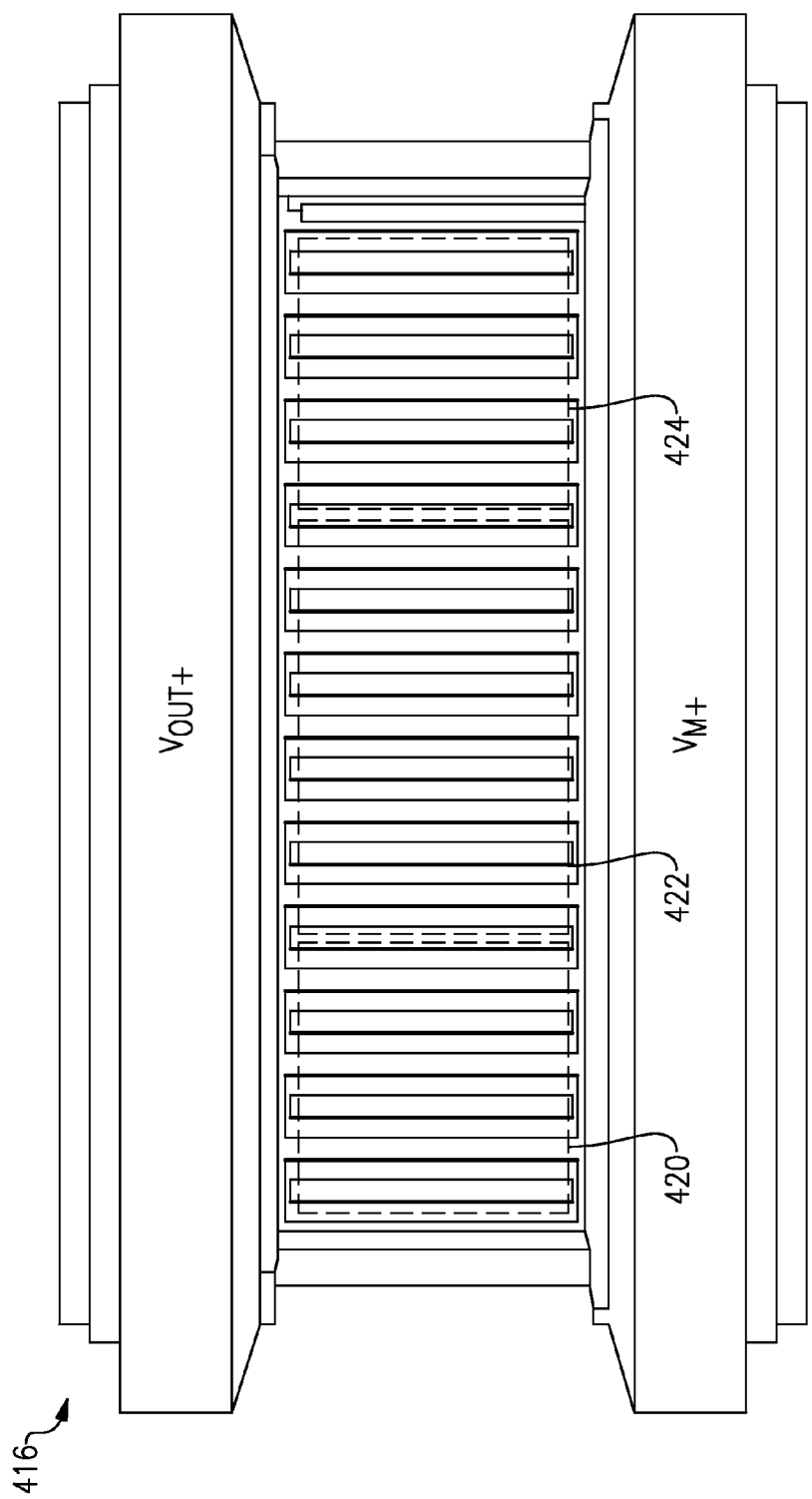
FIG. 3 is a top view metallization pattern of a bootstrapped field effect transistor according to an embodiment.

FIG. 3 is a top view metallization pattern of a bootstrapped field effect transistor 416 according to an embodiment. The same metallization pattern can be repeated across at least 2 metallization layers. In one example, the number of metallization layers used is 3. However, the number of metallization layers can vary in a broad range of two or more. It will be understood that only one metallization layer would ordinarily be needed to provide conductivity for the underlying transistor; however, in the illustrated embodiments, additional metallization layers are deliberately provided to add capacitance. Usually, a designer will try to minimize parasitic capacitance, and thus, these disclosed techniques proceed contrary to conventional wisdom. The bootstrapped field effect transistor 416 can represent the layout of an NFET in a CMOS process where a drain and a source are constructed using metal stripes, also referred to as fingers. The drain fingers and the source fingers are interleaved to form the bootstrapping capacitance. The bootstrapped field effect transistor 416 can further represent the second common gate NFET 116 of FIG. 1A. As illustrated in FIG. 4, a plurality of drain fingers and a plurality of source fingers connect between two metal conductors. A drain conductor labelled $V_{OUT+}$ connects to the drain fingers while a source conductor labelled $V_{M+}$ connects to the source fingers. Further advantageously, since the drain conductor and the source conductor are routed out only from one side in a conventional transistor layout, the proposed layout reduces electromigration between the drain conductor and the source conductor, which improves reliability.

In addition to connecting to the drain and to the source of the bootstrapped field effect transistor 416, the plurality of source fingers and the plurality of drain fingers can also be patterned to form a bootstrap capacitor. A source finger from the plurality of source fingers can be patterned above or below a drain finger from the plurality of drain fingers such that there is a finger capacitance between the source finger and the drain finger. The finger capacitance depends upon geometry and dielectric properties of the pattern; and a controllable design degree of freedom is a layer separation between the source finger and the drain finger. The layer distance can be controlled by selection of the interconnect/metal layer.

For instance, in designing the layout pattern of the plurality of source fingers and the plurality of drain fingers of transistor 416, a bootstrap capacitor can be formed by delineating a first region 420, a second region 422, and a third region 424. The first region 420 can be patterned with a first set of source fingers and a first set of drain fingers on metal layers having a first layer separation. The second region 422 can be patterned with a second set of source fingers and a second set of drain fingers on metal layers having a second layer separation. Similarly, the third region 424 can be patterned with a third set of source fingers and a third set of drain fingers on layers having a third separation. A first capacitance of the first region 420, a second capacitance of the second region 422, and a third capacitance of the third region 424 can be adjusted by controlling the area and the layer separations of the source fingers and the drain fingers.

Although FIG. 3 shows one possible way to create a bootstrap capacitor from the plurality of source fingers and the plurality of drain fingers, other configurations are possible. For instance, instead of having three regions of fingers, a single region having greater or fewer drain fingers or source fingers can be possible. In general, each source finger and each drain finger can be treated as an individual electrode of a capacitor proportional to an area of the drain/source finger divided by the separation distance between the fingers.

In addition to offering an advantage of a compact layout, using the plurality of source fingers and the plurality of drain fingers in transistor 416 to form the bootstrap capacitor can enhance device performance and power capability. And a similar approach can apply in forming a bootstrap capacitor in a PFET.

Applications

Devices employing the above described cascode amplifier topologies can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
    an amplifier comprising:
        a first circuit, wherein the first circuit is configured to receive an input signal, wherein the first circuit has neutralization of gate-to-drain parasitic capacitance;
        a second circuit, wherein the second circuit is configured to generate an amplified signal, wherein the first circuit and the second circuit together form a cascode circuit;
        a first node between the first circuit and the second circuit; and
        wherein the second circuit has at least a first capacitor having an amount of capacitance tailored to an intended operating band of the amplifier such that the first capacitor is configured to resonate with a first parasitic capacitance between the first node and an AC ground to substantially cancel the first parasitic capacitance.

2. The apparatus of claim 1:
    wherein the first circuit comprises a first differential circuit, and the input signal comprises a differential input signal, wherein the first differential circuit has cross-coupled capacitive coupling for neutralization;
    wherein the second circuit comprises a second differential circuit, and the amplified signal comprises a differential signal; and
    wherein the first differential circuit and the second differential circuit together form a differential cascode circuit.

3. The apparatus of claim 2 further comprising:
    a second node between the first circuit and the second circuit;
    wherein the second circuit has a second capacitor having an amount of capacitance tailored to an intended operating band of the amplifier such that the second capacitor is configured to resonate with a second parasitic capacitance between the second node and the AC ground to substantially cancel the second parasitic capacitance.

4. The apparatus of claim 3, wherein the first capacitor and the second capacitor are configured to resonate with the first parasitic capacitance and the second parasitic capacitance, respectively, without an inductor.

5. The apparatus of claim 3, wherein the first differential circuit comprises:
    a source coupled transistor pair comprising a first transistor and a second transistor configured to receive the differential input signal between a gate of the first transistor and a gate of the second transistor;
    a third capacitor electrically connected between the gate of the first transistor and a drain of the second transistor, wherein the third capacitor is configured to neutralize a gate-to-drain parasitic capacitance of the first transistor; and
    a fourth capacitor electrically connected between the gate of the second transistor and a drain of the first transistor wherein the fourth capacitor is configured to neutralize a gate-to-drain parasitic capacitance of the second transistor.

6. The apparatus of claim 5, wherein the second differential circuit comprises:
    a third transistor having a source electrically connected to the drain of the first transistor and a gate electrically connected to a bias source;
    a fourth transistor having a source electrically connected to the drain of the second transistor and a gate electrically connected to the bias source; and
    wherein the third transistor and the fourth transistor are configured to provide the amplified signal between a drain of the third transistor and a drain of the fourth transistor.

7. The apparatus of claim 6:
    wherein the first capacitor is electrically connected between the drain and the source of the third transistor; and
    wherein the second capacitor is electrically connected between the drain and the source of the fourth transistor.

8. The apparatus of claim 7, wherein the first transistor, the second transistor, the third transistor, and the fourth transistor comprise NMOS transistors.

9. The apparatus of claim 7, wherein the first transistor, the second transistor, the third transistor, and the fourth transistor comprise PMOS transistors.

10. The apparatus of claim 7, wherein the amplifier comprises an RF power amplifier configured to have a gain and stability factor at least partially dependent upon the first through fourth capacitors.

11. The apparatus of claim 7:
    wherein the third transistor comprises a drain metallization pattern forming a first electrode of the first capacitor and a source metallization pattern forming a second electrode of the first capacitor;
    wherein the fourth transistor comprises a drain metallization pattern forming a first electrode of the second capacitor and a source metallization pattern forming a second electrode of the second capacitor, wherein the metallization patterns are repeated on at least two metallization layers.

12. The apparatus of claim 11:
wherein the drain metallization pattern and the source metallization pattern of the third transistor have an area such that an amount of capacitance of the first capacitor is commensurate with the first parasitic capacitance; and
wherein the drain metallization pattern and the source metallization pattern of the fourth transistor have an area such that an amount of capacitance of the second capacitor is commensurate with the second parasitic capacitance.

13. The apparatus of claim 11, wherein the amplifier is embodied in an integrated circuit.

14. The apparatus of claim 1, wherein the first circuit comprises:
a common source transistor configured to receive the input signal at a gate of the common source transistor; and
a series LC network electrically connected between the gate of the common source transistor and a drain of the common source transistor, wherein the series LC network is configured to neutralize a gate-to-drain parasitic capacitance of the common source transistor.

15. The apparatus of claim 14, wherein the second circuit comprises:
a cascode transistor having a source electrically connected to the drain of the common source transistor and a gate electrically connected to a bias source; and
wherein the cascode transistor is configured to provide the amplified signal at a drain of the cascode transistor.

16. The apparatus of claim 15, wherein a first capacitor is electrically connected between the drain and the source of the cascode transistor, wherein the first capacitor is configured to resonate with a first parasitic capacitance between the drain of the common source transistor and an AC ground to substantially cancel the first parasitic capacitance.

17. The apparatus of claim 16, wherein the amplifier comprises an RF power amplifier configured to have a gain and stability factor at least partially dependent upon the first through fourth capacitors.

18. The apparatus of claim 16, wherein the cascode transistor comprises a drain metallization pattern forming a first plate of the first capacitor and a source metallization pattern forming a second plate of the first capacitor.

19. The apparatus of claim 18, wherein the drain metallization pattern and the source metallization pattern of the cascode transistor have an area such that an amount of capacitance of the first capacitor is commensurate with the first parasitic capacitance.

20. An apparatus for RF power amplification comprising:
a means for amplifying an input signal to generate an amplified signal;
a means for neutralizing a gate-to-drain parasitic capacitance of the amplifying means; and
a means for resonating with a parasitic capacitance between a node and an AC ground of the amplifying means to substantially cancel the first parasitic capacitance.

* * * * *